(12) United States Patent
Lei et al.

(10) Patent No.: US 8,580,630 B2
(45) Date of Patent: Nov. 12, 2013

(54) METHODS FOR FORMING A METAL GATE STRUCTURE ON A SUBSTRATE

(75) Inventors: Jianxin Lei, Fremont, CA (US); Xinyu Fu, Pleasanton, CA (US); Srinivas Gandikota, Santa Clara, CA (US); Jian Z. Ren, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 83 days.

(21) Appl. No.: 13/278,335

(22) Filed: Oct. 21, 2011

(65) Prior Publication Data

US 2013/0102144 A1    Apr. 25, 2013

(51) Int. Cl.
*H01L 21/8238*    (2006.01)

(52) U.S. Cl.
USPC ............... 438/199; 438/573; 257/E21.632

(58) Field of Classification Search
USPC ............ 438/197, 199, 573, 575, 582; 257/E21.632
See application file for complete search history.

(56) References Cited

U.S. PATENT DOCUMENTS

2010/0109098 A1* 5/2010 Lin et al. ............ 257/411
2012/0264284 A1* 10/2012 Wang et al. ............ 438/592

OTHER PUBLICATIONS

E. Cartier, et al., "Oxygen Passivation of Vacancy Defects in Metal-Nitride Gated HfO$_2$/SiO$_2$/Si Devices", *Applied Physics Letters*, 95, 042901 (2009).

* cited by examiner

*Primary Examiner* — Hoai V Pham
(74) *Attorney, Agent, or Firm* — Moser Taboada; Alan Taboada

(57) ABSTRACT

Methods for forming a metal gate structure on a substrate are provided herein. In some embodiments, a method for forming a metal gate structure on a substrate having a dielectric layer formed on the substrate may include depositing a metal layer while providing a process gas comprising oxygen to form an oxygen doped work function layer atop the dielectric layer; and depositing a metal gate layer atop dielectric layer.

20 Claims, 4 Drawing Sheets

METHODS FOR FORMING A METAL GATE STRUCTURE ON A SUBSTRATE

FIELD

Embodiments of the present invention generally relate to semiconductor processing.

BACKGROUND

The inventors have observed that conventionally used materials used to form work function layers in p-type metal oxide semiconductor (pMOS) transistors provide a work function that is inadequate and limits the speed of operation of the pMOS transistor. For example, conventionally used work function metals utilized to form work function layers of pMOS transistors typically provide a band gap value of about 4.6 eV. However, the inventors have observed that a higher work function (e.g., a band-edge work function of at least 4.9 eV) is necessary for the formation of a p-type metal oxide semiconductor (pMOS) transistor to provide sufficient speed for current semiconductor technologies.

Accordingly, the inventors have provided improved methods for forming metal gate structures.

SUMMARY

Methods for forming a metal gate structure on a substrate are provided herein. In some embodiments, a method for forming a metal gate structure on a substrate having a dielectric layer formed on the substrate may include depositing a metal layer while providing a process gas comprising oxygen to form an oxygen doped work function layer atop the dielectric layer; and depositing a metal gate layer atop dielectric layer.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
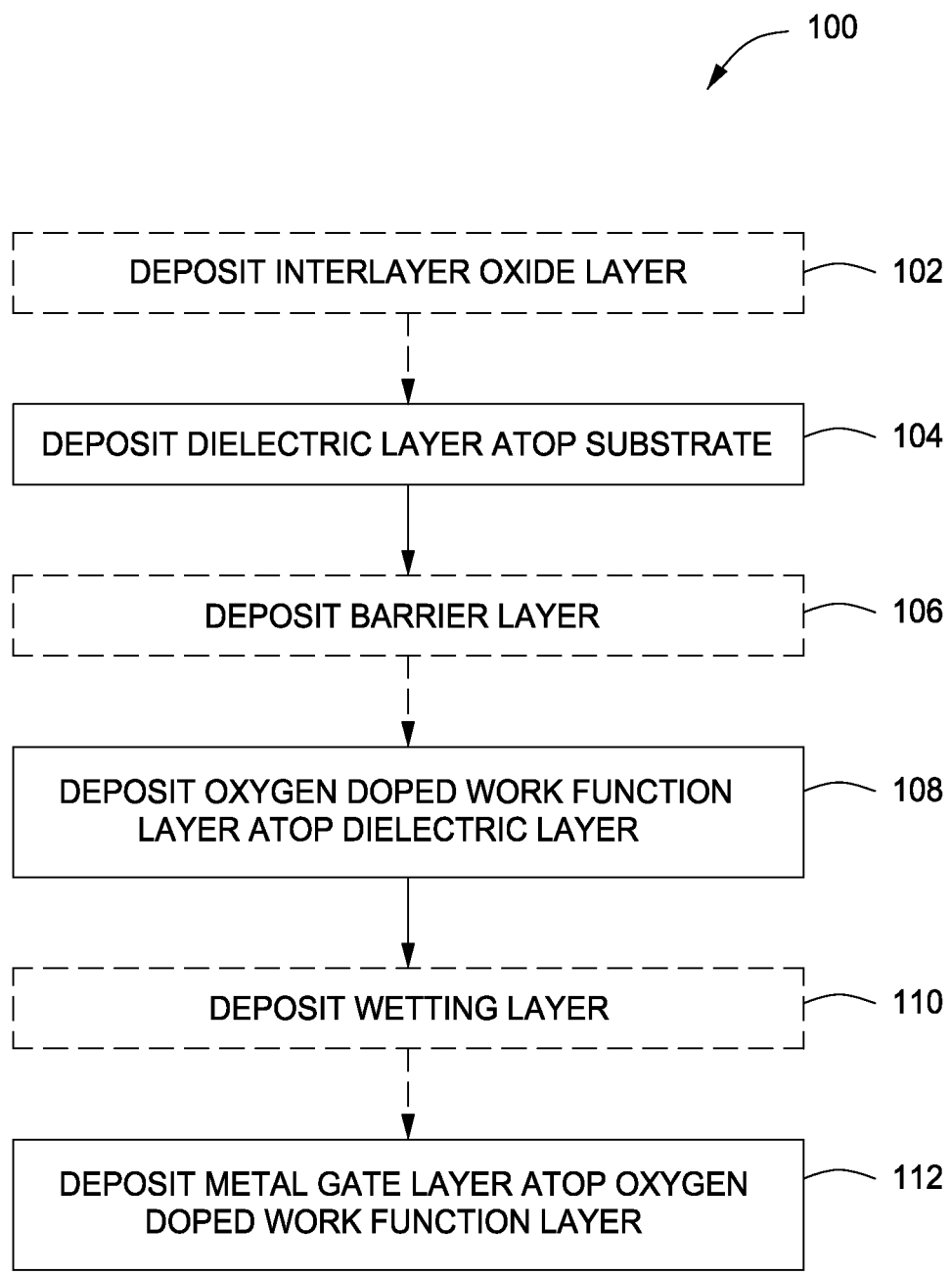
FIG. 1 is a flow diagram of a method for forming a metal gate structure on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for forming a metal gate structure on a substrate are provided herein. In some embodiments, the inventive methods may advantageously provide a metal gate structure comprising an oxygen doped work function layer having a higher work function as compared to conventionally formed work function layers. The increased work function of the oxygen doped work function layer may advantageously increase the speed of a transistor, for example a pMOS transistor, fabricated utilizing the oxygen doped work function layer.

Figure 2A:
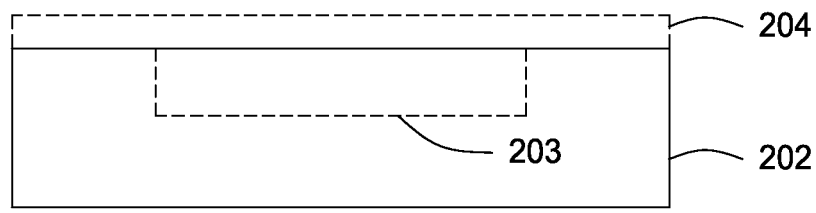
FIGS. 2A-F depict cross-sectional views of a substrate during different stages of the inventive methods in accordance with some embodiments of the present invention.
Figure 2B:
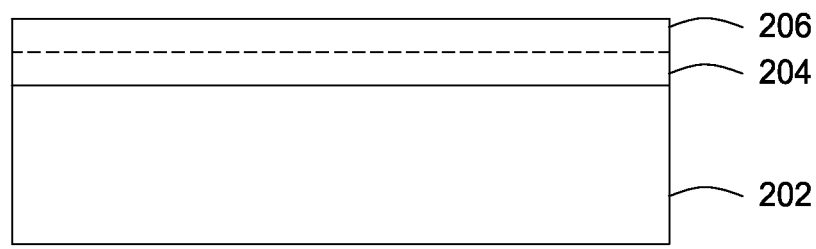

FIG. 1 is a method for forming a metal gate structure on a substrate in accordance with some embodiments of the present invention. The method 100 begins at 102, where an optional interlayer oxide layer 204 may be deposited atop a substrate 202, as shown in FIG. 2A. The substrate 202 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 202 may be a semiconductor wafer (e.g., a 200 mm, 300 mm, or the like silicon wafer), such as a doped or undoped polysilicon wafer, a doped or undoped silicon wafer, a patterned or non-patterned wafer, or the like.

In some embodiments, as shown in FIG. 2A, the substrate 202 may include one or more conductivity wells defined therein, such as a conductivity well (region) 203, for example, an n-type or p-type conductivity well. In some embodiments, such as where one or more devices are to be formed on the substrate 202, a plurality of field isolation regions (not shown) may be formed in the substrate 202 to isolate conductivity wells having different conductivity types (e.g., n-type or p-type) and/or to isolate adjacent transistors. The field isolation regions may be shallow trench isolation (STI) structures formed, for example, by etching a trench into the substrate 202 and then filling the trench with a suitable insulator, such as silicon oxide (oxide), silicon nitride (nitride), or the like.

In some embodiments, the interlayer oxide layer 204 may comprise silicon, for example such as silicon oxide ($SiO_2$). The interlayer oxide layer 204 may be deposited by any suitable deposition process, for example, atomic layer deposition (ALD), chemical vapor deposition (CVD), physical vapor deposition (PVD), or the like. The interlayer oxide layer 204 may be deposited to any thickness suitable for the particular application. For example, in some embodiments, the interlayer oxide layer 204 may be deposited to a thickness of less than about 10 Angstroms.

Next, at 104, a dielectric layer 206 may be deposited atop the substrate 202 (or optional interlayer oxide layer 204, when present). In some embodiments, the dielectric layer 206 may comprise a dielectric material having a high dielectric constant (K), such as a material having a dielectric constant greater than about 3.9. For example, the high-K dielectric material may be hafnium oxide ($HfO_2$), hafnium silicon oxide ($HfSiO_x$), hafnium silicon oxynitride ($HfSiNO_x$), or the like. The dielectric layer 106 may be deposited by any suitable deposition process, for example, atomic layer deposition (ALD), chemical vapor deposition (CVD), physical vapor deposition (PVD), or the like. The dielectric layer 206 may be deposited to any thickness suitable for the particular application. For example, in some embodiments, the dielectric layer 206 may be deposited to thickness of about 20 to about 25 Angstroms thick.

Figure 2C:
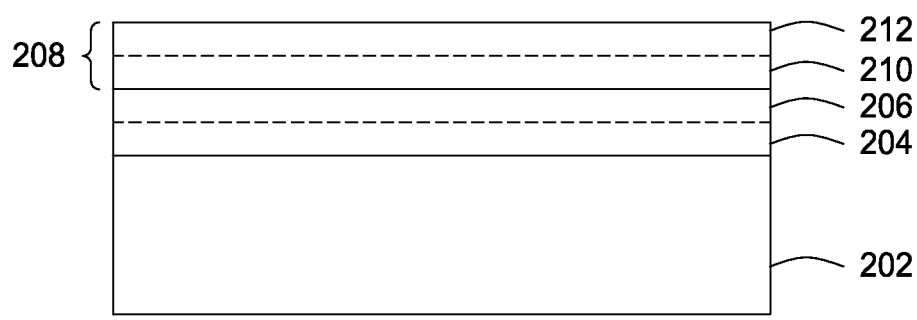
Figure 2D:
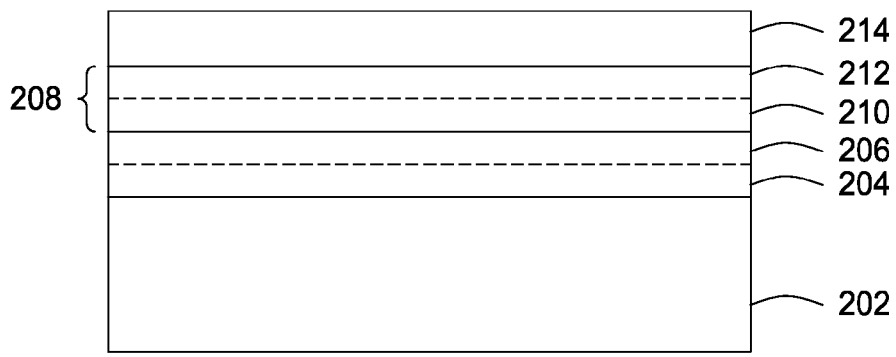
Figure 2E:
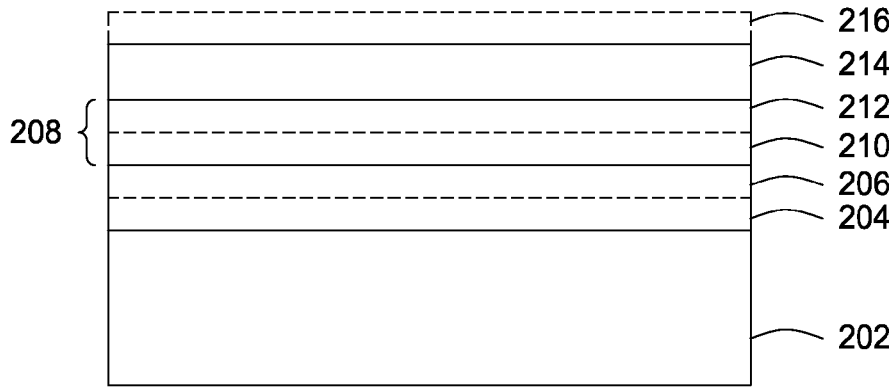
Figure 2F:
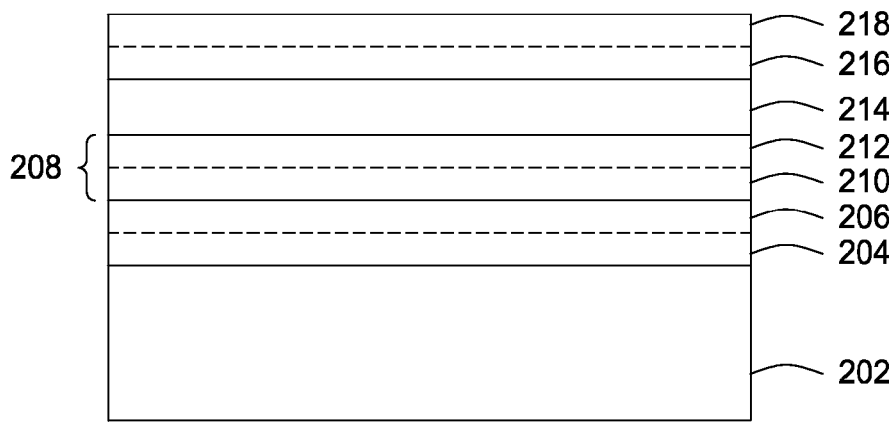

Next, at 106, an optional barrier layer 208 may be deposited atop the dielectric layer 206, as shown in FIG. 2C. The barrier layer 208 may comprise any materials suitable to reduce or prevent atom migration or diffusion between two adjacent layers in a metal gate structure (e.g. the dielectric layer 206 and oxygen doped work function layer 214, described below). For example, in some embodiments, the barrier layer may comprise a metal nitride, for example a transition metal nitride or transition metal alloy nitride, such as titanium nitride (TiN), tantalum nitride (TaN), tungsten nitride (WN), or the like.

In some embodiments, the barrier layer 208 may comprise multiple layers, for example such as a first layer 210 and second layer 212, as shown in the figure. In such embodiments, the first layer 210 may comprise titanium nitride (TiN) and the second layer 212 may comprise tantalum nitride (TaN). The barrier layer 208 may be deposited to any thickness suitable for a particular application. For example, in embodiments where the barrier layer 208 comprises the first layer 210 and the second layer 212, the first layer 210 may have a thickness of about 10 to about 20 angstroms, or about 20 angstroms, and the second layer 212 may have a thickness of about 10 to about 20 angstroms, or about 25 angstroms. The barrier layer 208 may be deposited by any suitable deposition process, for example, atomic layer deposition (ALD), chemical vapor deposition (CVD), physical vapor deposition (PVD), or the like.

The inventors have observed that a work function layer having a band-edge work function of at least 4.9 eV is necessary for the formation of a p-type metal oxide semiconductor (pMOS) transistor having a sufficient speed for current semiconductor technologies. However, conventionally used work function metals provide an inadequate band gap value (e.g., about 4.6 eV), thereby limiting the speed of operation of pMOS transistor. Accordingly, the inventors have observed that by utilizing an oxygen doped work function layer, the work function of the work function layer may be sufficiently increased. For example, in some embodiments, the a flat-band voltage (Vft) shift in a positive direction of great than about 100 meV, or in some embodiments greater than about 200 meV.

Accordingly next at 108, an oxygen doped work function layer 214 is deposited atop the dielectric layer 206. In some embodiments, the oxygen doped work function layer 214 may comprise a metal, for example, a transition metal nitride or transition metal alloy nitride, such as titanium nitride (TiN), nitrided titanium aluminum (TiAlN), tantalum nitride (TaN), tungsten nitride (WN), or the like. In such embodiments, the ratio of nitrogen to the metal may be varied to adjust the work function.

The work function layer 214 may be deposited via physical vapor deposition (PVD) in any suitable process chamber, for example, any process chamber having a target configured to sputter a source material atop the substrate 202, such as the process chamber 300 described below. For example, in some embodiments, the work function layer 214 may be deposited by providing a deposition gas mixture into the process chamber to react with the source material from the target. The reaction causes the target to eject atoms of the source material, which are then directed towards the substrate 202, thus depositing material.

In an exemplary deposition process, in embodiments where the work function layer 214 comprises titanium nitride (TiN), the source material may comprise titanium (Ti). The deposition gas mixture may comprise a nitrogen containing gas, for example, nitrogen ($N_2$). In some embodiments, the nitrogen containing gas may be provided at a flow rate of between about 30 to about 200 sccm. The flow rate of the nitrogen containing gas may be varied to control the reaction between the nitrogen containing gas and the titanium and the source material of the target, thus controlling the composition of nitrogen to the source material in the deposited layer. In some embodiments the deposition gas mixture may also include an inert gas, such as argon (Ar). When present, the inert gas may be provided at a flow rate of up to about 100 sccm. In some embodiments, the nitrogen containing gas and the inert gas may be pre-mixed and provided to the process chamber together, or in some embodiments, provided to the process chamber via separate conduits and/or gas sources (e.g., gas sources 362, 363, 369 and conduits 371, 373, 375 of process chamber 300 described below).

The inventors have observed that conventionally used methods to form oxygen doped layers (e.g., oxygen doped work function layers) typically require a post deposition annealing of the layer in an oxygen based atmosphere. However, such methods only provide oxygen incorporation in the surface of the annealed layer and require an extra process step (i.e., the post deposition annealing), thus decreasing the efficiency and productivity of the process. Accordingly, in some embodiments, an oxygen containing gas may be provided to the process chamber as the source material is deposited to form the oxygen doped work function layer 214. By providing the oxygen containing gas while depositing the source material, the inventors have observed that the oxygen dopes work function layer attains uniform oxygen incorporation throughout the film. In addition, no additional processes are required to form the oxygen doped work function layer 214 (e.g., such as the post deposition annealing process discussed above), thereby increasing efficiency and productivity of the process.

The oxygen containing gas may be any oxygen containing gas, for example such as an oxygen ($O_2$) gas. The oxygen containing gas may be provided to the process chamber at any flow rate suitable to provide a desired amount of oxygen in the oxygen doped work function layer 214. For example in some embodiments, the oxygen containing gas may be provided at a flow rate of about 0.5 to about 3 sccm. In some embodiments, the flow rate of the oxygen containing gas may be varied to adjust the work function of the oxygen doped work function layer 214. In some embodiments, the oxygen containing gas may be provided to the process chamber via a separate conduit and/or gas supply (e.g., gas supply 369 and conduit 375 of process chamber 300 described below).

In some embodiments, a source power may be applied to the target during processing to maintain a plasma formed from the deposition gas mixture. In some embodiments, the source power may comprise a DC power of up to about 5 kW. The DC power may be varied throughout the process to facilitate selective deposition of the oxygen doped work function layer 214.

In some embodiments, to facilitate deposition of the ejected atoms of the target material on the substrate 202, a bias power in the form of RF power may be applied to the substrate 202 via an electrode (e.g. substrate support pedestal 352 of process chamber 300 described below). In some embodiments, 1 kW to about 5 kW of RF power may be supplied at a frequency of between 0.02 to about 100 MHz.

Next, at 110, in some embodiments, an optional wetting layer 216 may be deposited atop the oxygen doped work function layer 214. When present, the wetting layer 216 facilitates uniform deposition of subsequent layers (e.g., the metal gate layer 218 described below). The wetting layer 216 may comprise any materials suitable to facilitate uniform deposition of subsequent layers and may be dependent on the layer to be deposited. For example, in some embodiments, the wetting layer may comprise a metal, such as aluminum (Al) or the like, a transition metal, such as titanium (Ti), cobalt (Co), or the like, or a transition metal alloy, or the like.

The wetting layer 216 may be deposited by any suitable deposition process, for example, atomic layer deposition (ALD), chemical vapor deposition (CVD), physical vapor deposition (PVD), or the like. The wetting layer 216 may be deposited to any thickness suitable for the particular application. For example, in some embodiments, the wetting layer 216 may be deposited to a thickness of about 5 to about 20 angstroms.

Next, at 112, a metal gate layer 218 may be deposited atop the oxygen doped work function layer 214 (or the wetting layer 216 when present). The metal gate layer 218 may comprise any materials suitable for a desired application. For example, in some embodiments, the metal gate layer 218 may comprise a metal, such as aluminum (Al), a transition metal, such as tungsten (W), cobalt (Co), or the like, a transition metal alloy, a silicide of a transition metal or transition metal alloy, or the like.

The metal gate layer 218 may be deposited by any suitable deposition process, for example, atomic layer deposition (ALD), chemical vapor deposition (CVD), physical vapor deposition (PVD), or the like. The metal gate layer 218 may be deposited to any thickness suitable for the particular application. For example, in some embodiments, the metal gate layer 218 may be deposited to a thickness of about 400 to about 2000 angstroms.

Upon depositing the metal gate layer 218 at 112, the method 100 generally ends and additional process steps (not shown) may be performed to complete fabrication of the semiconductor device and/or other devices (not shown) on the substrate 202. Additional process steps may include ion implantation to form source/drain regions in the substrate 202.

Figure 3:
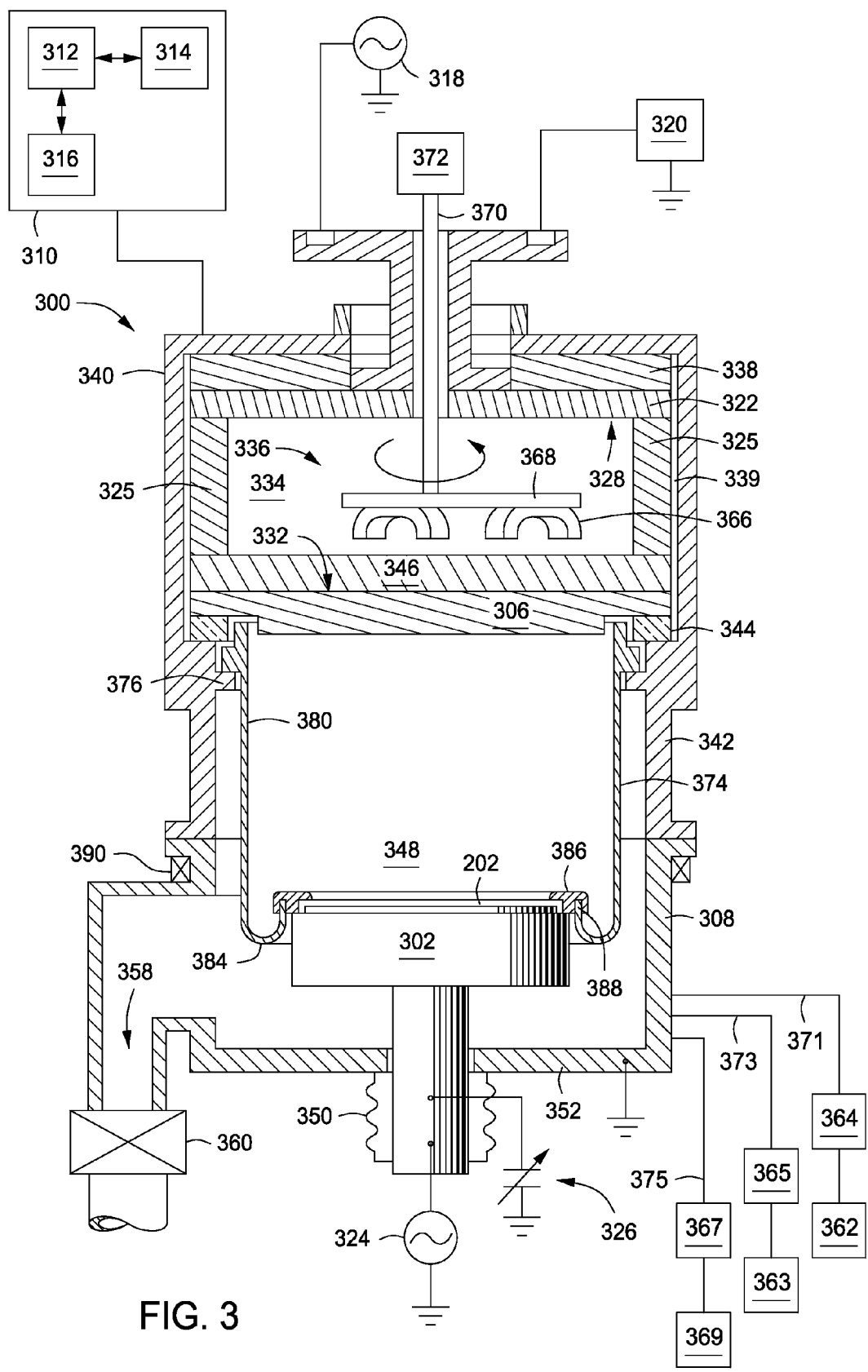
FIG. 3 depicts a process chamber suitable to perform the inventive methods in accordance with some embodiments of the present invention.

FIG. 3 depicts a process chamber 300 adapted for performing the inventive methods in accordance with some embodiments of the present invention. An example of a suitable PVD chamber is the AVENIR™ PVD processing chamber, commercially available from Applied Materials, Inc., of Santa Clara, Calif. It is contemplated that other process chambers from other manufactures may also be utilized to perform the present invention.

The process chamber 300 contains a substrate support pedestal 302 for receiving a substrate 304 thereon, and a sputtering source, such as a target 306. The substrate support pedestal 302 may be located within a grounded enclosure wall 308, which may be a chamber wall (as shown) or a grounded shield (a ground shield 340 is shown covering at least some portions of the chamber 300 above the target 306. In some embodiments, the ground shield 340 could be extended below the target to enclose the pedestal 302 as well).

In some embodiments, the process chamber includes a feed structure for coupling RF and DC energy to the target 306. The feed structure is an apparatus for coupling RF and DC energy to the target, or to an assembly containing the target, for example, as described herein. A first end of the feed structure can be coupled to an RF power source 318 and a DC power source 320, which can be respectively utilized to provide RF and DC energy to the target 306. For example, the DC power source 320 may be utilized to apply a negative voltage, or bias, to the target 306. In some embodiments, RF energy supplied by the RF power source 318 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure may be fabricated from suitable conductive materials to conduct the RF and DC energy from the RF power source 318 and the DC power source 320.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the target 306 via a conductive member 325. The conductive member 125 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening of the body via the hole of the source distribution plate 322. The cavity 334 and the central opening of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the distribution plate 322, the conductive member 325, and the target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar 340 may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thereby improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 106 may be supported on a grounded conductive aluminum adapter 342 through a dielectric isolator 344. The target 306 comprises a material to be deposited on the substrate 304 during sputtering, such a metal or metal oxide. In some embodiments, the backing plate 346 may be coupled to the source distribution plate-facing surface 332 of the target 306. The backing plate 346 may comprise a conductive material, such as copper-zinc, copper-chrome, or the same material as the target, such that RF and DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the chamber 300 and thereafter raised to a deposition, or processing position. One or more processing gases may be supplied from a one or more gas sources (three gas sources 362, 363, 369) through one or more mass flow controllers (three mass flow controllers 364, 365, 367 shown) into the lower part of the chamber 300 via one or more conduits (three conduits 371, 373, 375 shown). An exhaust port 358 may be provided and coupled to a pump (not shown) via a valve 360 for exhausting the interior of the process chamber 300 and facilitating maintaining a desired pressure inside the process chamber 300.

An RF bias power source 324 may be coupled to the substrate support pedestal 302 in order to induce a negative DC bias on the substrate 304. In addition, in some embodiments, a negative DC self-bias may form on the substrate 304 during processing. For example, RF power supplied by the RF bias power source 324 may range in frequency from about 2 MHz to about 60 MHz, for example, non-limiting frequencies such as 2 MHz, 13.56 MHz, or 60 MHz can be used. In other applications, the substrate support pedestal 302 may be grounded or left electrically floating. For example, a capacitance tuner 326 may be coupled to the substrate support pedestal for adjusting voltage on the substrate 304 for applications where RF bias power may not be desired.

A rotatable magnetron assembly 336 may be positioned proximate a back surface (e.g., source distribution plate-facing surface 332) of the target 306. The rotatable magnetron assembly 336 includes a plurality of magnets 366 supported by a base plate 368. The base plate 368 connects to a rotation shaft 370 coincident with the central axis of the chamber 300 and the substrate 304. A motor 372 can be coupled to the upper end of the rotation shaft 370 to drive rotation of the magnetron assembly 336. The magnets 366 produce a magnetic field within the chamber 300, generally parallel and close to the surface of the target 306 to trap electrons and increase the local plasma density, which in turn increases the sputtering rate. The magnets 366 produce an electromagnetic field around the top of the chamber 300, and magnets 366 are rotated to rotate the electromagnetic field which influences the plasma density of the process to more uniformly sputter the target 306. For example, the rotation shaft 370 may make about 0 to about 150 rotations per minute.

In some embodiments, the chamber 300 may further include a process kit shield 374 having an internal surface 380 facing the central region 348. In some embodiments, the process kit shield 374 may be connected to a ledge 376 of the adapter 342. The adapter 342 in turn is sealed and grounded to the aluminum chamber sidewall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in its lower, loading position but rests on the outer periphery of the substrate support pedestal 302 when it is in its upper, deposition position to protect the substrate support pedestal 302 from sputter deposition. An additional deposition ring (not shown) may be used to shield the periphery of the substrate 304 from deposition.

In some embodiments, a magnet 390 may be disposed about the chamber 200 for selectively providing a magnetic field between the substrate support pedestal 302 and the target 306. For example, as shown in FIG. 3, the magnet 390 may be disposed about the outside of the chamber wall 308 in a region just above the substrate support pedestal 302 when in processing position. In some embodiments, the magnet 390 may be disposed additionally or alternatively in other locations, such as adjacent the adapter 342. The magnet 390 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory, or computer readable medium, 314 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. Inventive methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

Thus, methods for forming a metal gate structure on a substrate have been provided herein. In some embodiments, the inventive methods may advantageously provide a metal gate structure comprising an oxygen doped work function layer having a higher work function as compared to conventionally formed work function layers. The increased work function of the oxygen doped work function layer may advantageously increase the speed of a transistor, for example a pMOS transistor, fabricated with the oxygen doped work function layer.

While the foregoing is directed to embodiments of the present invention, other and further embodiments of the invention may be devised without departing from the basic scope thereof.

The invention claimed is:

1. A method for forming a metal gate structure on a substrate having a dielectric layer formed on the substrate, comprising:
   providing the substrate to a process chamber having a target comprising a source material to be deposited atop the substrate;
   forming a plasma from a process gas provided to the process chamber;
   sputtering the source material from the target to deposit a metal layer while providing an oxygen containing gas to the process chamber to form an oxygen doped work function layer atop the dielectric layer; and
   depositing a metal gate layer atop the oxygen doped work function layer.

2. The method of claim 1, wherein the substrate comprises an oxide layer formed on the substrate between the substrate and the dielectric layer.

3. The method of claim 1, wherein the dielectric layer comprises one of hafnium oxide ($HfO_2$), hafnium silicon oxide ($HfSiO_2$), or hafnium silicon oxynitride (HfSiON).

4. The method of claim 1, wherein the dielectric layer is about 20 to about 25 angstroms thick.

5. The method of claim 1, further comprising:
   depositing a barrier layer atop the dielectric layer before forming the oxygen doped work function layer.

6. The method of claim 5, wherein depositing the barrier layer comprises:
   depositing a first layer comprising titanium nitride (TiN) to a thickness of about 10 to about 20 angstroms; and
   depositing a second layer comprising tantalum nitride (TaN) to a thickness of about 10 to about 20 angstroms.

7. The method of claim 1, wherein the oxygen doped work function layer comprises a nitride of a transition metal or a transition metal alloy.

8. The method of claim 1, wherein the oxygen doped work function layer is formed to a thickness of about 20 to about 60.

9. The method of claim 1, wherein the source material comprises a transition metal.

10. The method of claim 1, wherein the process gas comprises a nitrogen containing gas.

11. The method of claim 10, wherein the nitrogen containing gas is provided at a flow rate of about 30 to about 200 sccm.

12. The method of claim 10, wherein the process gas further comprises argon (Ar).

13. The method of claim 12, wherein the argon is provided at a flow rate of up to about 100 sccm.

14. The method of claim 13, wherein the nitrogen containing gas and argon (Ar) are provided to the process chamber via separate gas lines.

15. The method of claim 1, wherein the oxygen containing gas is provided at a flow rate of about 0.5 to about 3 sccm.

16. The method of claim 15, wherein the process gas and the oxygen containing gas are provided to the process chamber via separate gas lines.

17. The method of claim 1, further comprising,
   depositing a wetting layer atop the work function layer before depositing the metal gate layer.

18. The method of claim 17, wherein the wetting layer comprises aluminum (Al) or a transition metal.

19. The method of claim 1, wherein the metal gate layer comprises aluminum (Al), a transition metal, or a silicide of a transition metal.

20. A method for forming a metal gate structure on a substrate having a dielectric layer formed on the substrate, comprising:
   depositing a first layer comprising titanium nitride (TiN) to a thickness of about 10 to about 20 angstroms;
   depositing a second layer comprising tantalum nitride (TaN) to a thickness of about 10 to about 20 angstroms, wherein the first layer and second layer form a barrier layer deposited atop the dielectric layer;
   depositing a metal layer while providing a process gas comprising oxygen to form an oxygen doped work function layer atop the barrier layer; and
   depositing a metal gate layer atop the oxygen doped work function layer.

* * * * *